(12) United States Patent
Palmer

(10) Patent No.: US 11,988,563 B2
(45) Date of Patent: May 21, 2024

(54) TEMPERATURE EXCEPTION TRACKING IN A TEMPERATURE LOG FOR A MEMORY SYSTEM

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 687 days.

(21) Appl. No.: 17/153,107

(22) Filed: Jan. 20, 2021

(65) Prior Publication Data

US 2022/0228925 A1 Jul. 21, 2022

(51) Int. Cl.
| | |
|---|---|
| *G11C 16/04* | (2006.01) |
| *G01K 1/02* | (2021.01) |
| *G01K 1/022* | (2021.01) |
| *G05B 19/042* | (2006.01) |
| *G06F 16/2455* | (2019.01) |

(52) U.S. Cl.
CPC ............. *G01K 1/022* (2013.01); *G01K 1/028* (2013.01); *G05B 19/0428* (2013.01); *G06F 16/24558* (2019.01)

(58) Field of Classification Search
CPC ................................................ G06F 16/24558
See application file for complete search history.

(56) References Cited

U.S. PATENT DOCUMENTS

| | | | | |
|---|---|---|---|---|
| 10,056,147 | B1 * | 8/2018 | Alexopoulos | ......... G06F 3/0685 |
| 10,838,645 | B2 * | 11/2020 | Basu | ....................... G06F 3/061 |
| 11,709,727 | B2 * | 7/2023 | Muchherla | .......... G06F 11/0793 |
| | | | | 714/6.11 |

* cited by examiner

*Primary Examiner* — Pho M Luu
(74) *Attorney, Agent, or Firm* — Holland & Hart LLP

(57) ABSTRACT

Methods, systems, and devices for temperature exception tracking in a temperature log for a memory system are described. The memory system may store the temperature log separate from data to which the temperature information corresponds. For example, a memory device may store data in a relatively higher-level cell and the corresponding temperature information in a relatively lower-level cell. To perform a write operation, the memory system may determine a current temperature at which the data is being written or was written to a partition of a memory device and may indicate in the temperature log if the current temperature is entering a temperature range that is outside a threshold temperature (e.g., a nominal temperature). To perform a read operation, the memory system may determine if the data to read was written to the memory device outside the threshold temperature to determine whether to perform temperature compensation for the read operation.

25 Claims, 7 Drawing Sheets

US 11,988,563 B2

TEMPERATURE EXCEPTION TRACKING IN A TEMPERATURE LOG FOR A MEMORY SYSTEM

FIELD OF TECHNOLOGY

The following relates generally to one or more systems for memory and more specifically to temperature exception tracking in a temperature log for a memory system.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
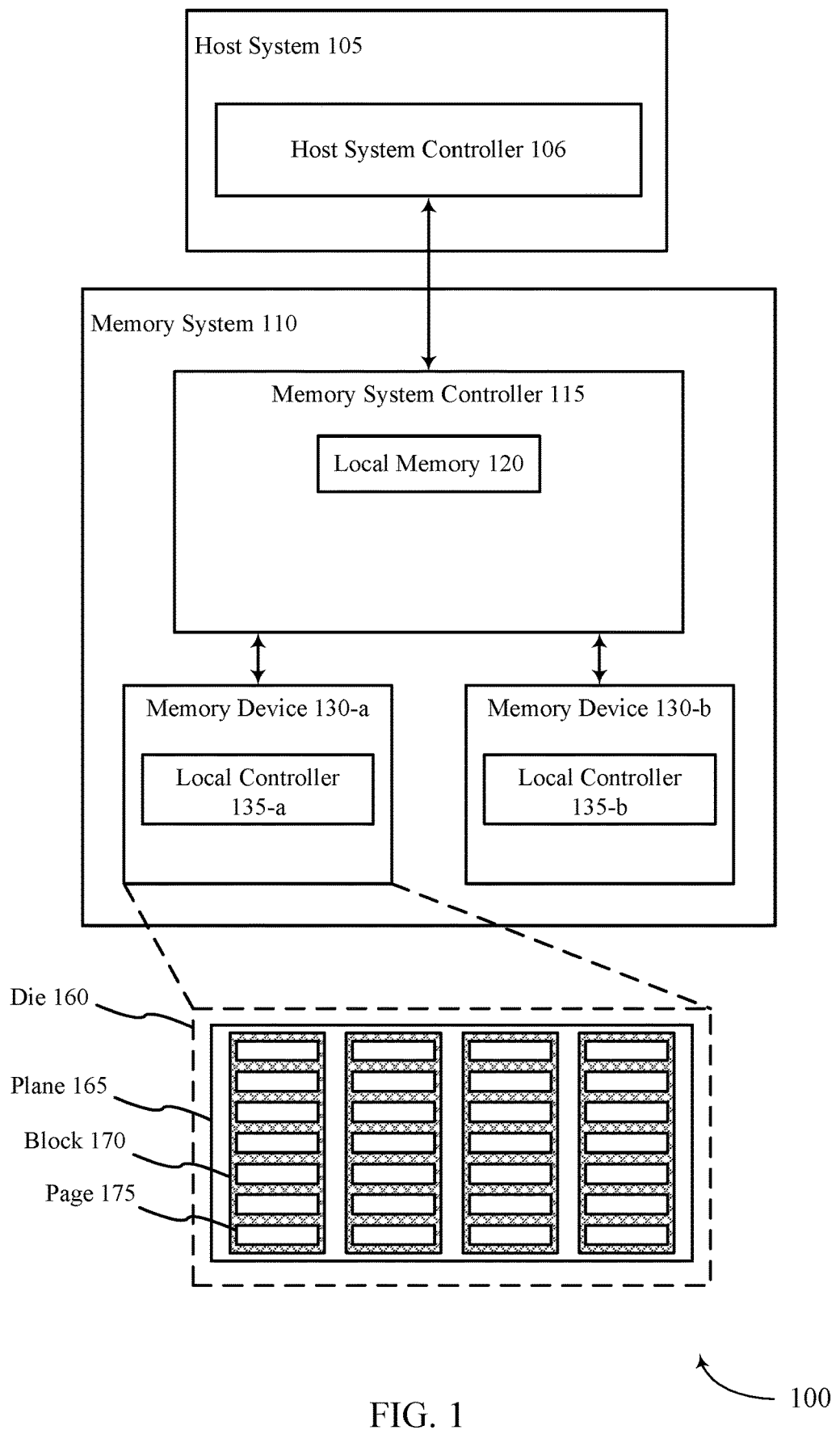
FIGS. 1 and 2 illustrate examples of systems that support temperature exception tracking in a temperature log for a memory system in accordance with examples as disclosed herein.

In some memory systems, data storage may be impacted by temperature. For example, if data is written to a memory device at an extreme temperature (e.g., outside a threshold temperature such as above a first threshold temperature or below a second threshold temperature), the data retention capabilities of the memory device may be significantly reduced due to the extreme temperature. Temperatures may be especially impactful for some higher-level not- and (NAND)-based memory storage cells, such as quad-level cells (QLCs), where the greater quantity of levels relies on a greater precision of voltage distributions to accurately store data. For example, writing data to a NAND cell may involve setting multiple voltage distributions within the cell, and reading data from the NAND cell may involve accurately detecting the multiple voltage distributions to determine the corresponding data. However, such voltage distributions can shift or expand if writing data to a cell based on the current temperature of the cell. As such, the memory system may fail to successfully read data from a cell at one temperature if the data was written to the cell at a second temperature outside a "nominal" temperature threshold (e.g., where the nominal temperature threshold may include a range of temperatures at which the effect of temperature on data retention is insignificant). If the system is able to determine the temperature outside the "nominal" temperature threshold at which the data was written, the system may compensate for the effects of the temperature and successfully read the data. Some systems may determine and store temperature metadata (e.g., an indication of the temperature, an error correction power, or both) with the data during a write operation to be used for accurately reading the data. However, this temperature metadata may similarly be affected by the temperature being outside the "nominal" temperature threshold, reducing the reliability of such temperature metadata. Further, some operations (e.g., copyback operations or other NAND operations) may fail to update the metadata, such that the temperature metadata may not accurately track the temperature information for the data following the operations (e.g., if the data is rewritten or otherwise changed and the temperature metadata is unchanged). Accordingly, such systems may fail to accurately store temperature information to be used for temperature compensation if performing, for example, read operations.

As described herein, a memory system may implement one or more techniques to support temperature exception tracking in a temperature log. By storing temperature information in a temperature log separate from the data to which the temperature information corresponds, the memory system may mitigate the effects of extreme temperatures on the temperature information and may maintain accurate temperature information if performing operations on the data (e.g., copyback operations or other NAND operations). For example, the memory system may store data in relatively higher-level cells (e.g., Tri-Level Cells (TLCs), QLCs) while storing the corresponding temperature information in relatively lower-level cells (e.g., single-level cells (SLCs)) that are relatively less susceptible to temperature-based effects. As such, the temperature information may be successfully read from the temperature log to determine a temperature compensation to use for reading the corresponding data from a memory device.

A memory device may store the temperature log and, for example, a set of temperature ranges of interest. A memory system or the memory device may detect temperature readings while performing write operations. If the memory system or memory device determines that the temperature at which data is written to the memory device exits one temperature range and enters another temperature range (e.g., crosses a temperature threshold), the memory system may create a new log entry for the temperature log indicating the new temperature range and the position in the memory device at which the data is being written, among other information. Additionally or alternatively, the memory system may create a new log entry if the memory device switches from writing to a first virtual block to writing to a second virtual block, among other conditions. To perform a read operation, the memory system may identify the virtual pages of the memory device to read and may search the temperature log—or a set of binary trees or other data structures created to support searching the temperature log—for the temperature information corresponding to these virtual pages. If the temperature information indicates that the data was written to the memory device at a temperature outside a temperature threshold (e.g., outside a nominal temperature range), the memory device may apply a temperature compensation corresponding to the temperature information to accurately read the data from the memory device.

Features of the disclosure are initially described in the context of systems and devices as described with reference to FIGS. 1 and 2. Features of the disclosure are described in the context of process flows and a storage configuration as described with reference to FIGS. 3A, 3B, and 4. These and other features of the disclosure are further illustrated by and described with reference to an apparatus diagram and flowcharts that relate to temperature exception tracking in a temperature log for a memory system as described with reference to FIGS. 5-7.

FIG. 1 illustrates an example of a system 100 that supports temperature exception tracking in a temperature log for a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or any combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some examples, a memory device 130 may operate using or according to virtual blocks and virtual pages. A virtual block may correspond to one block 170 of each plane 165 and each NAND die 160. Each virtual block may include multiple virtual pages. In some cases, multiple virtual pages may correspond to a physical page 175 (e.g., four virtual pages per physical page 175). In some examples, a virtual block may include tens of thousands of virtual pages (e.g., depending on the size of the memory device 130). The memory device 130 may perform read and write operations according to the virtual blocks and virtual pages. In some examples, one or more virtual pages, virtual blocks, pages 175, blocks 170, or memory devices 130 may be referred to as a "partition" or a "subset" of a memory system 110.

In some cases, a NAND memory device 130 may include memory cells configured to each store one bit of information, which may be referred to as SLCs. Additionally or alternatively, a NAND memory device 130 may include memory cells configured to each store multiple bits of information, which may be referred to as multi-level cells (MLCs) if configured to each store two bits of information, as TLCs if configured to each store three bits of information, as QLCs if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be used instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support temperature exception tracking in a temperature log for a memory system. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

A memory device 130 of the memory system 110 may store a temperature log and a set of temperatures, such as temperature ranges, of interest. The memory system 110 or the memory device 130 (or both), for example, may detect temperature readings while performing one or more access operations, such as write operations. If the memory system 110 or memory device 130 determines that the temperature at which data is written to the memory device 130, for example, exits one temperature range and enters another temperature range, the memory system 110 may create a new log entry for the temperature log indicating the new temperature range and the position in the memory device 130 at which the data is being written (e.g., a current cursor position), among other information. Additionally or alternatively, the memory system 110 may create a new log entry if the memory device 130 switches from writing to a first virtual block to writing to a second virtual block, among other conditions. To perform a read operation, the memory system 110 may identify the virtual pages of the memory device 130 to read and may search the temperature log—or a set of binary trees or other data structures created to support searching the temperature log—for the temperature information corresponding to these virtual pages. If the temperature information indicates that the data was written to the memory device 130 at a temperature outside a temperature threshold (e.g., outside a nominal temperature range), the memory device 130 may apply a temperature compensation corresponding to the temperature information to allow for accurately reading the data from the memory device 130. This temperature tracking and temperature compensation may be performed by the memory system 110, the memory device 130, or any combination thereof, and may in some examples be transparent to a host system 105.

Although the features of the disclosure are described herein with reference to NAND memory devices 130, it is to be understood that the features of the disclosure may be implemented with other memory devices 130 or memory systems 110. For example, one or more features of the disclosure described herein may be implemented in non-volatile memory or other memory devices 130.

Figure 2:
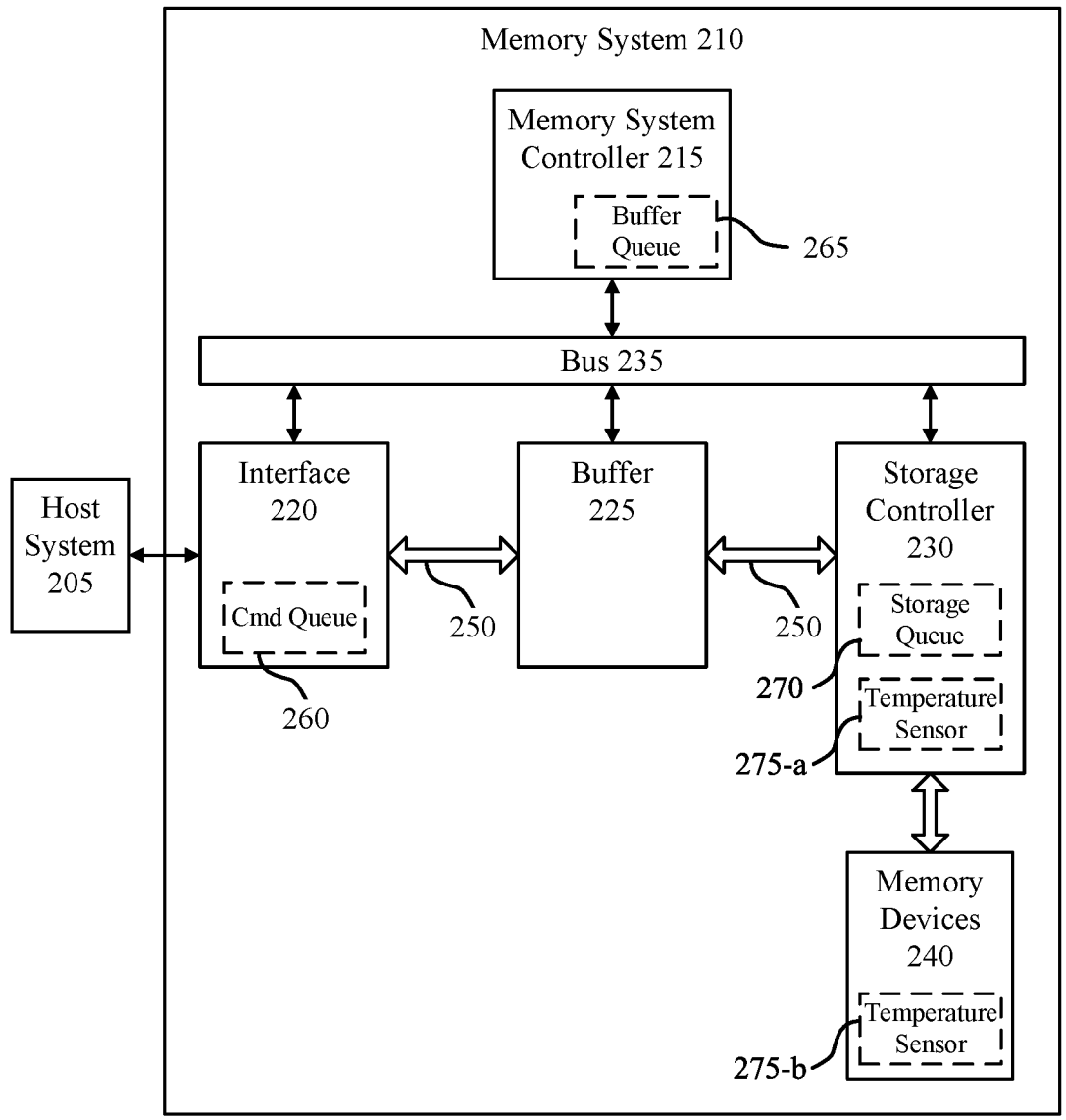

FIG. 2 illustrates an example of a system 200 that supports temperature exception tracking in a temperature log for a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3-dimensional (3D) cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205.

The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, once the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

The memory system 210 may support temperature exception tracking at a memory device 240 to support temperature compensations for access operations, such as read operations. For example, the storage controller 230, a memory device 240 (or multiple memory devices 240), or both may include a respective temperature sensor 275. In some cases, the storage controller 230 may include a temperature sensor 275-a and one or more memory devices 240 may include respective temperature sensors 275-b (e.g., at one or more NAND dies, as described with reference to FIG. 1). The temperature sensors 275 may perform temperature readings for the memory system 210 or for a specific memory device 240. In some examples, a temperature sensor 275 may be triggered to perform a temperature reading with each write command. Additionally or alternatively, a temperature sensor 275 may periodically or aperiodically perform temperature readings (e.g., based on a timer or a counter). In some cases, the memory system 210 (e.g., the storage controller 230) may determine multiple temperature readings for a specific timestamp or operation (e.g., write operation) and may determine a current temperature value based on the multiple temperature readings. For example, both a temperature sensor 275-a and a temperature sensor 275-b may detect temperature readings. The memory system 210 may average the temperature readings, select a "most accurate" temperature reading, select a "worst case" temperature reading (e.g., a temperature reading corresponding to a greatest temperature compensation factor or a highest temperature from a group or a lowest temperature for a group), or perform some other operation to determine the current temperature.

The memory system 210 may additionally store a set of temperatures, such as a set a temperature ranges (e.g., at the memory system controller 215, the storage controller 230, or one or more memory devices 240). In some examples, if data is written to a NAND memory device 240 when the device temperature is within a range of the set of temperature ranges, the memory system 210 may implement special handling on read operations to be able to account for the temperature at a later time, such as if performing a write operation. The temperature ranges may be based on the NAND characterizations for the memory devices 240. For example, different temperature ranges may correspond to different temperature compensation values for reading data from a memory device 240 (e.g., based on one or more aspects of the memory device 240). The temperature ranges and corresponding temperature compensation values may be stored, for example, in a lookup table. In some cases, the memory system 210 may store a set of temperature ranges of a same size. For example, the memory system 210 may store temperature ranges spanning five degrees Celsius (° C.) between −25° C. and 85° C. In some other cases, the memory system 210 may store a "nominal" temperature range and one or more "extreme" temperature ranges of different sizes. The nominal temperature range may correspond to no temperature compensation or minimal temperature compensation for reading data, while each extreme temperature range may correspond to a respective temperature compensation value for reading data. For example, the nominal temperature range may span from 0° C. to 65° C. for a memory device 240 in a smartphone, 0° C. to 100° C. for a memory device 240 in a vehicle, or another supported temperature range. The extreme temperature ranges may be more granular, and extreme temperature ranges farther from the nominal temperature range may correspond to more significant temperature compensation values. The set of temperature ranges may be pre-defined for a memory system 210 or memory device 240, or may be dynamically determined (e.g., based on one or more determinations or measurements by one or more components in real time or based on usage).

The memory system 210 may use the temperature readings and temperature ranges to perform temperature exception tracking. For example, the memory system 210 may generate log entries for a temperature log based on the temperature readings. If the memory system 210 is writing data to a memory device 240, the memory system 210, memory device 240, or storage controller 230 may determine the current temperature (e.g., the temperature at which the data is written to the memory device 240). If the current temperature is entering a new temperature range, the memory system 210 may create a new log entry for the new temperature range (e.g., in volatile memory of the storage controller 230). Additionally or alternatively, if the storage controller 230 switches to writing data into a different virtual block of a memory device 240, the memory system 210 may create a new log entry for the different virtual block. The memory system 210 may create any quantity of log entries during a write operation or a write procedure. The storage controller 230 may periodically or aperiodically copy the log entries into a temperature log in persistent memory (e.g., in a memory device 240). For example, the data may be persisted in NAND-based QLCs, while the temperature log may be persisted in NAND-based SLCs.

To read data from a memory device 240, the memory system 210 may leverage the temperature log to support temperature compensation. For example, the storage controller 230 may determine a partition in a memory device 240 from which to read data. The storage controller 230 may search the temperature log for any temperature information corresponding to the partition. In some cases, the memory system 210 may create one or more data structures (e.g., binary trees) in the storage controller 230 (e.g., in volatile memory) to support efficient searching of the temperature log. If the storage controller 230 determines the data was written to the partition at a temperature outside a threshold temperature (e.g., a nominal temperature range), the storage controller 230 may identify a temperature compensation to apply to the read operation. For example, the storage controller 230 may determine the temperature range at which the data was written to the partition and the temperature compensation value corresponding to this temperature range. In some cases, applying the temperature compensation may involve adjusting, at an MNAND device, one or more voltage thresholds for reading data from a cell (e.g., based on a current temperature at which the data is read and the temperature at which the data was written). Applying the temperature compensation may mitigate the negative effects of temperature on data retention and reading accuracy, effectively reducing the bit-error rate associated with read operations, among other advantages.

The techniques described herein may support separating temperature indicators from the at-risk data written at extreme temperatures. For example, by storing the temperature log separately from the corresponding data, the temperature log may be stored in a manner or structure (e.g., a lower-level cell relative to the corresponding data) that mitigates the negative effects of temperature on data retention. Additionally, by storing a single temperature log entry to indicate multiple consecutive virtual pages within a virtual block with data written within a specific temperature range, the memory system 210 may reduce storage overhead for temperature information (e.g., as compared to a system storing temperature metadata for every virtual page or every virtual page written outside a nominal temperature range). Furthermore, the techniques described herein may support copyback operations and other NAND-based operations. For example, for copyback operations, the temperature log may be updated to indicate updated temperature information at which the copyback operation is performed to ensure alignment of the temperature information and the corresponding data.

Figure 3A:
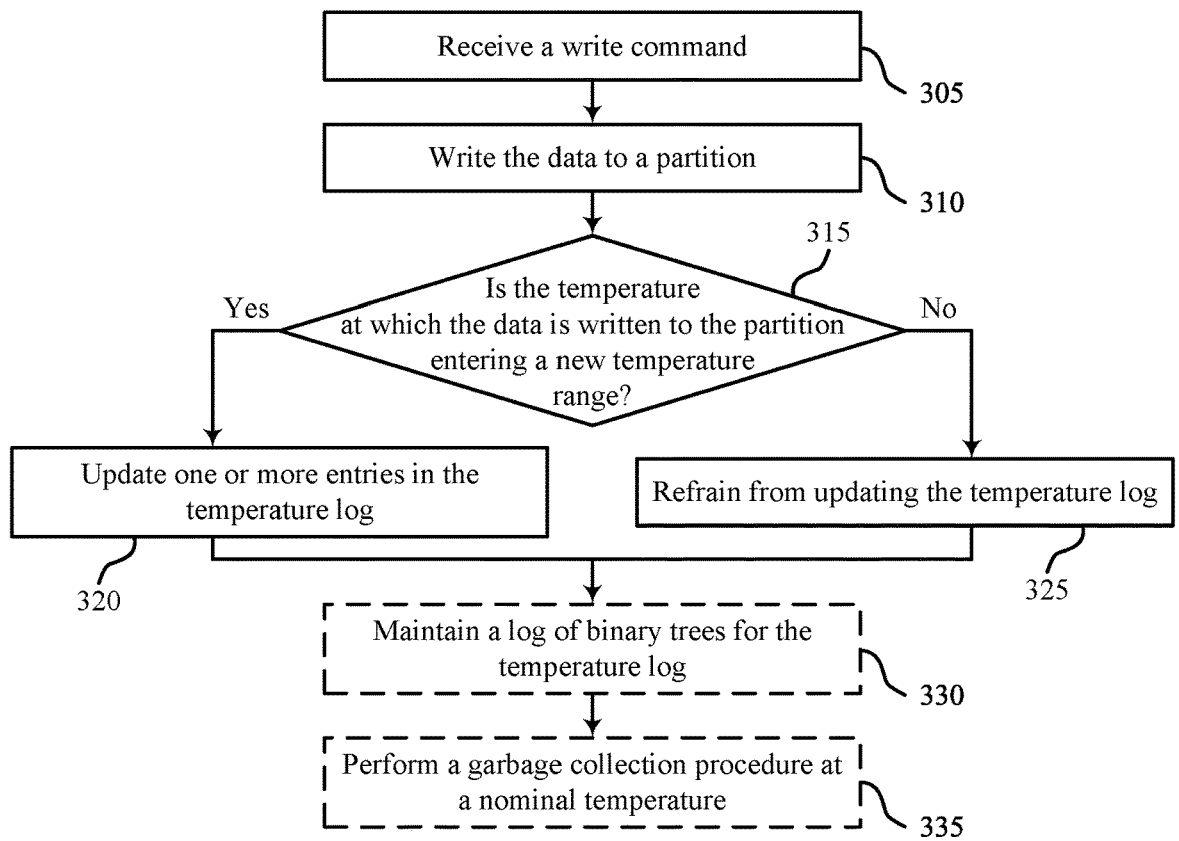
FIGS. 3A and 3B illustrate examples of process flows that support temperature exception tracking in a temperature log for a memory system in accordance with examples as disclosed herein.
Figure 3B:
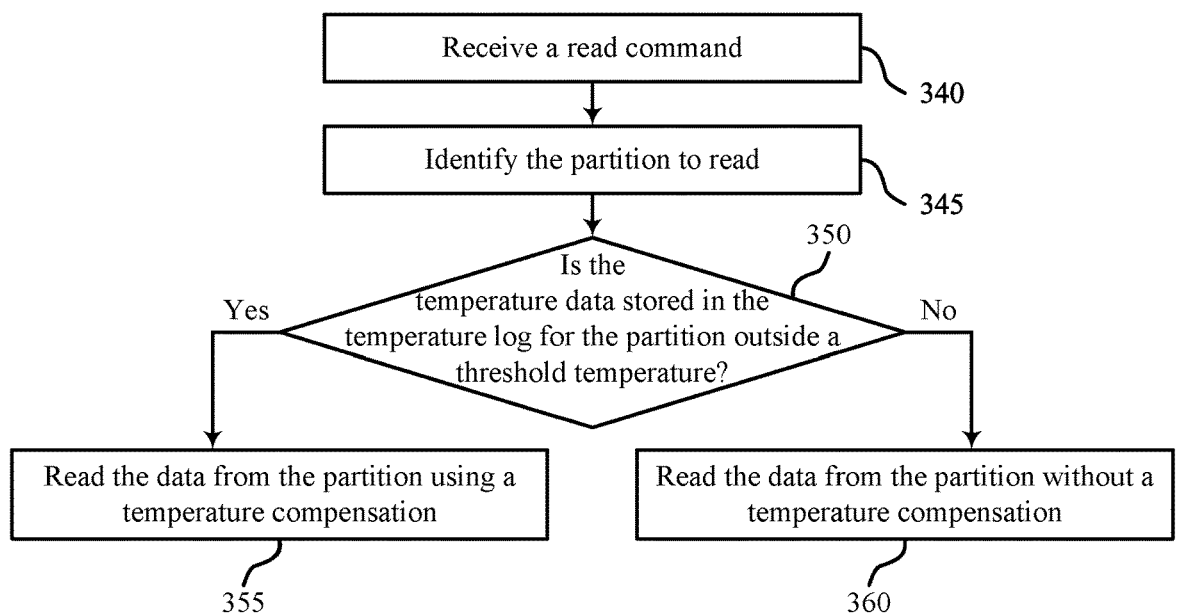

FIGS. 3A and 3B illustrate examples of process flows 300 that support temperature exception tracking in a temperature log for a memory system in accordance with examples as disclosed herein. For example, FIG. 3A illustrates an example of a process flow 300-a that supports a write operation. The process flow 300-a may be performed by a memory system, as described with reference to FIGS. 1 and 2. For example, a controller coupled with a memory array (e.g., which may be a component of the memory system) may perform one or more functions described herein. Alternative examples of the following may be implemented, where some steps are performed in a different order than described or are not performed at all. In some cases, steps may include additional features not mentioned below, or further steps may be added.

At 305, a write command may be received. For example, a memory system may receive the write command from a host system. The write command may indicate data to write to a memory device (e.g., which may include NAND-based memory storage cells or other types of memory storage cells like FeRAM or DRAM, or both). NAND storage may be programmed in a page-sequential order across one or more grouped blocks. Each grouped block may be referred to as a virtual block (e.g., virtual block 0 may correspond to block 0 on all planes and NAND dies in a memory device). Within a virtual block, each potential storage location of a host logical block addressed by a host LBA may be referred to as a virtual page. The virtual pages can be counted sequentially beginning at 0 at the start of a virtual block and incrementing in programming order. The position that is next-to-be-programmed in a virtual block may be called a cursor. In some cases, one or more virtual pages, one or more virtual blocks, or any combination thereof may be referred to as a partition or a subset.

At 310, the data may be written to a partition based on the write command. For example, a controller (e.g., a storage controller) may store the data in a partition of the memory device starting at the cursor position. The controller, memory device, memory system, or any combination thereof may determine a temperature (e.g., a current temperature) at which the data is written to the partition. The temperature reading for the memory device may fall within a temperature range of a set of pre-defined temperature ranges or relative to one or more temperature thresholds (e.g., one end of a temperature range).

At 315, the controller may determine if the temperature at which the data is written to the partition is entering a new temperature range. For example, the controller may determine that the memory device was at a first temperature within a first temperature range when data was written to the preceding virtual page and may determine whether the memory device is at a second temperature within a second (i.e., different) temperature range when writing the data at 310 to a current virtual page (e.g., the virtual page at the cursor position). The controller may manage a temperature log (e.g., a temperature event log) based on the determination.

At 320, one or more entries of the temperature log may be updated. For example, if the memory device temperature enters a different temperature region, the controller may create a new entry identifying the current cursor position (e.g., of one or more respective cursors) and the temperature region. For example, the entry may be associated with a specific virtual block and may indicate the virtual page (e.g., a start position) at which the temperature entered the different temperature region. If the memory device temperature leaves a temperature region, the controller may update the relevant entries for that temperature region (e.g., with a count value equal to the current cursor position minus the start position, or with an end position for the cursor if leaving the temperature region).

Additionally or alternatively, if a virtual block is closed (e.g., the controller writes to the last virtual page of the virtual block), the controller may finish the entry for the closed virtual block (e.g., set the count or end position value for the entry) and may create a new entry for the new virtual block assigned to that cursor. In some examples, if copyback or garbage collection is performed at extreme temperatures, the controller may update temperature log entries for data written during the copyback or garbage collection procedures. If the controller creates or updates a log entry, the controller may write the log entry to a NAND memory device (e.g., an SLC block). For example, the entries may be created and updated at the controller in volatile memory (e.g., a cache) and persisted in a temperature log in a memory device.

The temperature log may be stored in a lower-level cell than one or more cells that may store the corresponding data. For example, if the data is stored in a QLC, the temperature log may be stored in a TLC, an MLC, or an SLC. If the data is stored in a TLC, the temperature log may be stored in an MLC or SLC. If the data is stored in an MLC, the temperature log may be stored in an SLC. In this way, the temperature information may be stored in a structure that may be more resilient to the negative effects of temperature than the structure storing the data, which may allow for greater accuracy and protection of the temperature information while not substantially diminishing the ability to store the data using higher-level cell techniques.

At 325, the temperature log may not be updated. For example, if the memory device temperature does not enter a different temperature region, the controller may refrain from updating any entries for the temperature log. By refraining from writing temperature information if the temperature does not enter a different temperature region, the memory system may reduce processing overhead, storage overhead, and latency (however minor) associated with temperature exception tracking. In some cases, a controller may record an entry in the temperature log if the temperature enters and exits a nominal temperature region. In other cases, the controller may refrain from recording temperature information related to a nominal temperature region.

In some cases, at 330, a log, such as a log of binary trees, may be maintained for the temperature log. The binary trees, as just one example of multiple alternatives, may support efficient searching of the temperature log. In some examples, the memory system may support a different data structure for searching the temperature log. The memory system may create the binary trees in volatile memory (e.g., in a cache). In some cases, one or more binary trees may be created dynamically, such as on demand (e.g., based on a received read operation). The controller may create an index on the temperature log of the binary trees, where a binary tree may include the records associated with a corresponding virtual block that has at least one record stored in the temperature log. A binary tree may be based on the virtual page start values stored in the temperature log entries for fast searching of the temperature log information. In some cases, if power is lost to the memory system, the binary trees may be lost from memory (e.g., if the binary trees are stored (e.g., cached) in volatile memory). If the memory system regains power, the memory system may reconstruct the trees by reading the temperature log.

In some cases, at 335, garbage collection may be performed based on temperature information. For example, a controller (e.g., a storage controller) may perform a garbage collection procedure based on the memory device temperature being within a nominal temperature range (e.g., inside a threshold temperature). The controller may scan the temperature log to determine data written at extreme temperatures (e.g., temperatures above or below a nominal temperature range) and rewrite the data to other partitions of the memory device while the memory device is within the nominal temperature range. Based on this garbage collection procedure, the controller may update or delete the temperature log entries related to this data previously written at the extreme temperatures. In this way, the controller may dynamically (e.g., automatically) reduce the amount of data written to the memory device at extreme temperatures.

FIG. 3B illustrates an example of a process flow 300-*b* that supports a read operation. The process flow 300-*b* may be performed by a memory system, as described with reference to FIGS. 1, 2, and 3A. For example, a controller coupled with a memory array (e.g., which may be a component of the memory system) may perform one or more functions described herein. Alternative examples of the following may be implemented, where some steps are performed in a different order than described or are not performed at all. In some cases, steps may include additional features not mentioned below, or further steps may be added.

At 340, a read command may be received. For example, a memory system may receive the read command from a host system. The read command may indicate data to read from a memory device (e.g., a NAND-based memory storage cell). For example, the read command may indicate a host LBA corresponding to the data.

At 345, a partition may be identified. For example, a controller (e.g., a storage controller) may translate the host LBA indicated by the read command to a physical address in the memory device (e.g., using an L2P mapping table). The physical address may correspond to a virtual block and virtual page of the memory device. In some cases, the one or more virtual blocks, one or more virtual pages, or combination thereof to read may correspond to the partition (e.g., a subset of the memory device).

At 350, the controller may determine if the data was written to the partition outside a threshold temperature. For example, the controller may identify or create (e.g., on demand) a binary tree corresponding to the determined virtual block and may search the binary tree for a node corresponding to the partition. The node may indicate a temperature range at which the data was written to the partition. In some cases, depending on the amount of data to read, the partition may correspond to multiple temperature ranges.

If the data was written to the partition at a temperature outside the temperature threshold, at 355, the controller may read the data from the partition using a temperature compensation. For example, the temperature log may indicate a temperature region in which the data was written to the partition that is below a first threshold temperature value (e.g., below a nominal temperature range), above a second threshold temperature value (e.g., above a nominal temperature range), below a threshold temperature range (e.g., the nominal temperature range), above the threshold temperature range (e.g., the nominal temperature range), or any combination thereof. This temperature region may correspond to a temperature compensation value or function for adjusting one or more aspects of the data during the read operation to effectively mitigate the negative effects that the temperature had on the data during the write operation.

If the data was written to the partition at a temperature inside the temperature threshold (e.g., within the nominal temperature range), at 360, the controller may read the data from the partition without using a respective temperature compensation. For example, the temperature log may not indicate a temperature region in which the data was written to the partition or may indicate that the data was written at a nominal temperature. Accordingly, the controller may refrain from performing a temperature compensation procedure on the data during the read operation.

Aspects of the process flows 300-*a* and 300-*b* may be implemented by a controller, among other components. Additionally or alternatively, aspects of the process flows 300-*a* and 300-*b* may be implemented as instructions stored in memory (e.g., firmware stored in a memory coupled with a memory device 240 or storage controller 230). For example, the instructions, when executed by a controller (e.g., the storage controller 230), may cause the controller to perform the operations of the process flows 300-*a* and 300-*b*.

Figure 4:
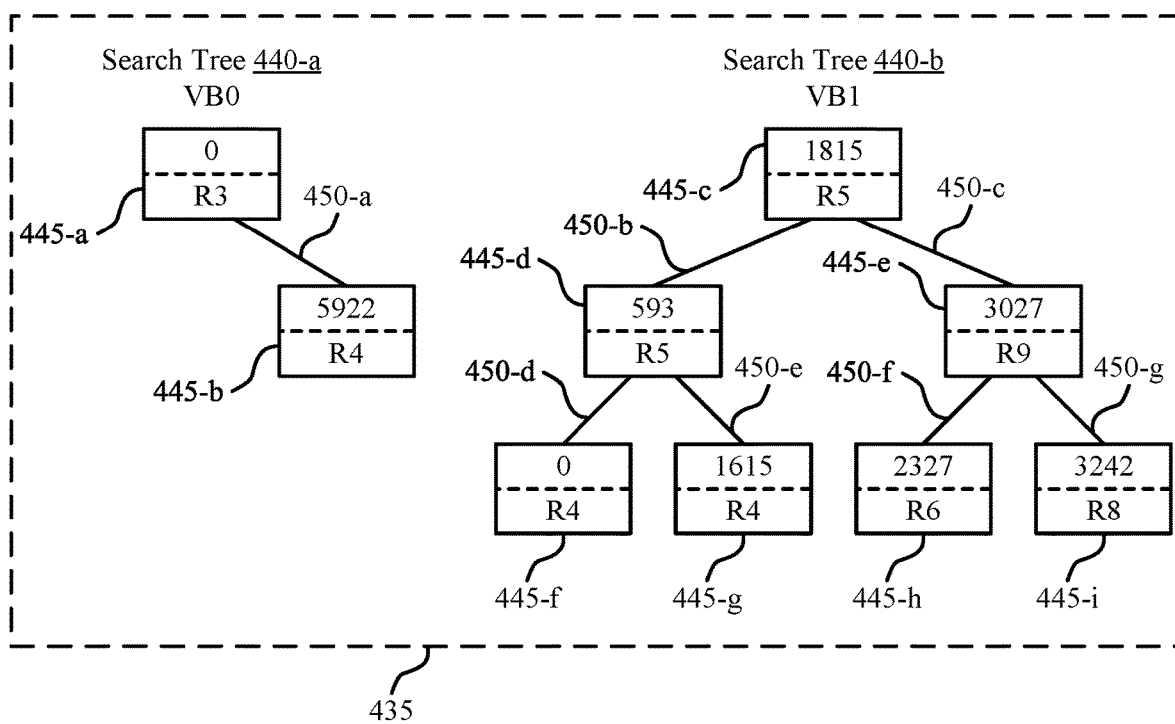
FIG. 4 illustrates an example of a storage configuration that supports temperature exception tracking in a temperature log for a memory system in accordance with examples as disclosed herein.

FIG. 4 illustrates an example of a storage configuration 400 that supports temperature exception tracking in a temperature log for a memory system in accordance with examples as disclosed herein. The storage configuration 400 may be supported by a memory system, memory device, controller, or some combination thereof as described with reference to FIGS. 1, 2, 3A, and 3B. For example, entries for the temperature log 405 may be created and updated in volatile memory (e.g., in a cache at a controller, such as a storage controller), while the temperature log 405 may be persisted in a memory device (e.g., an SLC). The temperature ranges 410 may defined for a memory system or memory device and may be stored at the memory system or memory device. One or more structures, such as search trees 440, may be generated based on the temperature log 405 and may be stored (e.g., persistently stored) in memory at a memory device, temporarily stored (e.g., cached) at a controller, or both. In some cases, the search trees 440 may be generated dynamically, such as on demand, for example, if a read command is received for a virtual block with an entry in the temperature log 405 but does not currently have a generated search tree 440.

The search trees 440 may be examples of binary search trees. However, it is to be understood that a memory system may implement additional or alternative data structures to support efficient searching of the temperature log 405. Additionally, while FIG. 4 illustrates an example of ten temperature ranges 410, it is to be understood that any quantity and size of temperature ranges 410 may be supported. In some cases, the temperature log 405 and a lookup table for the temperature ranges 410—and corresponding error correction powers—may be stored in persistent storage (e.g., non-volatile memory 430), while the search trees 440 may be stored in volatile memory 435.

The temperature log 405 may store temperature information for one or more partitions of the memory system in one or more log entries. An entry in the temperature log may indicate a virtual block value 415, a start virtual page value 420, a count 425 (or, alternatively, an end virtual page value), and a temperature range 410 in some examples. Each temperature range 410 may correspond to a temperature range 410 of interest in a lookup table of temperature ranges 410. For example, the memory system may include temperature ranges R0 410-a, R1 410-b, R2 410-c, R3 410-d, R4 410-e, R5 410-f, R6 410-g, R7 410-h, R8 410-i, and R9 410-j.

Data may be written to the temperature log 405 sequentially. For example, a controller may write data to virtual block 0 of a memory device at R3 410-d starting at virtual page 0. The controller may create a log entry for virtual block 0 with a start virtual page value 420 of 0 and a temperature range 410 of R3 410-d. Subsequently, the temperature for the memory device may exit R3 410-d and enter R4 410-e. This temperature change may occur when the cursor is on virtual page 5922 (e.g., when the controller is writing data to virtual page 5922 of virtual block 0). Accordingly, the controller may close out the first entry by writing the count 425 of 5922 (or, alternatively, an end virtual page value of 5921) and create a new entry for virtual block 0 with a start virtual page value 420 of 5922 and a temperature range 410 of R4 410-e. If the controller closes a virtual block, the controller may also close a current log entry and create a new entry. For example, the controller may write data to a last virtual page of virtual block 0 and may close the second entry by writing the count 425 of 2270. The controller may create a new log entry for the next virtual block to which the cursor moves (e.g., virtual block 1). This new log entry may indicate the same or a different temperature range 410 as the previous log entry for the previous virtual block. As illustrated in FIG. 4, the temperature ranges 410 may increase or decrease between entries, one or more temperature ranges 410 may be skipped between entries, and entries may be incomplete (e.g., if the controller is currently writing to a virtual block in a temperature range 410).

The controller may generate one or more search trees 440 corresponding to the temperature log 405. A search tree 440 may include one or more nodes 445 connected by branches 450. A search tree 440 may, in some examples, correspond to the entries in the temperature log 405 for a corresponding virtual block value 415. For example, the search tree 440-a corresponds to virtual block 0 and the search tree 440-b corresponds to virtual block 1. Each node 445 of a search tree 440 may, in some examples, be based on a start virtual page value 420 for a log entry and may indicate the corresponding temperature range 410 for the entry. A node 445 may include up to two branches 450 (e.g., a left child pointer, a right child pointer, both, or neither). For example, the node 445-a may be connected to the node 445-b by a branch 450-a. Because the branch 450-a is a right child pointer, the branch 450-a may indicate that the node 445-b (e.g., the child node) has a start virtual page value 420 greater than the node 445-a (e.g., the parent node). A left child pointer may indicate that the child node has a start virtual page value 420 less than the parent node.

The controller may use a search tree 440 to quickly search for a temperature compensation value (e.g., for a read operation). For example, the controller may receive a read command and may determine that the data to read is stored at virtual page 900 of virtual block 1. The controller may identify the search tree 440-b corresponding to virtual block 1. For example, the search tree 440-b may be stored in a cache or may be created dynamically, such as on demand, based on the read command. To perform the search, the controller may check the root node 445-c of the search tree 440-b. Because 900 is less than 1815 (i.e., the start virtual page value 420 of the node 445-c), and because the node 445-c has a left child pointer (e.g., branch 450-b), the controller may traverse the branch 450-b to the node 445-d. Because 900 is greater than 593 and the node 445-d has a right child pointer, the controller may traverse the branch 450-e to the node 445-g. Because 900 is less than 1615, but the node 445-g does not have a left child pointer, the controller may determine that virtual page 900 corresponds to the node 445-d (e.g., greater than 593 but less than 1615). Accordingly, the controller may determine that the data was written to virtual page 900 at a temperature range R5 410-f and may use a corresponding temperature compensation to read the data from the virtual page 900 of virtual block 1. Such a tree traversal procedure may be used to determine a temperature range for any virtual page of virtual block 1 represented by the nodes 445-c, 445-d, 445-e, 445-f, 445-g, 445-h, and 445-i and the branches 450-b, 450-c, 450-d, 450-e, 450-f, and 450-g.

Figure 5:
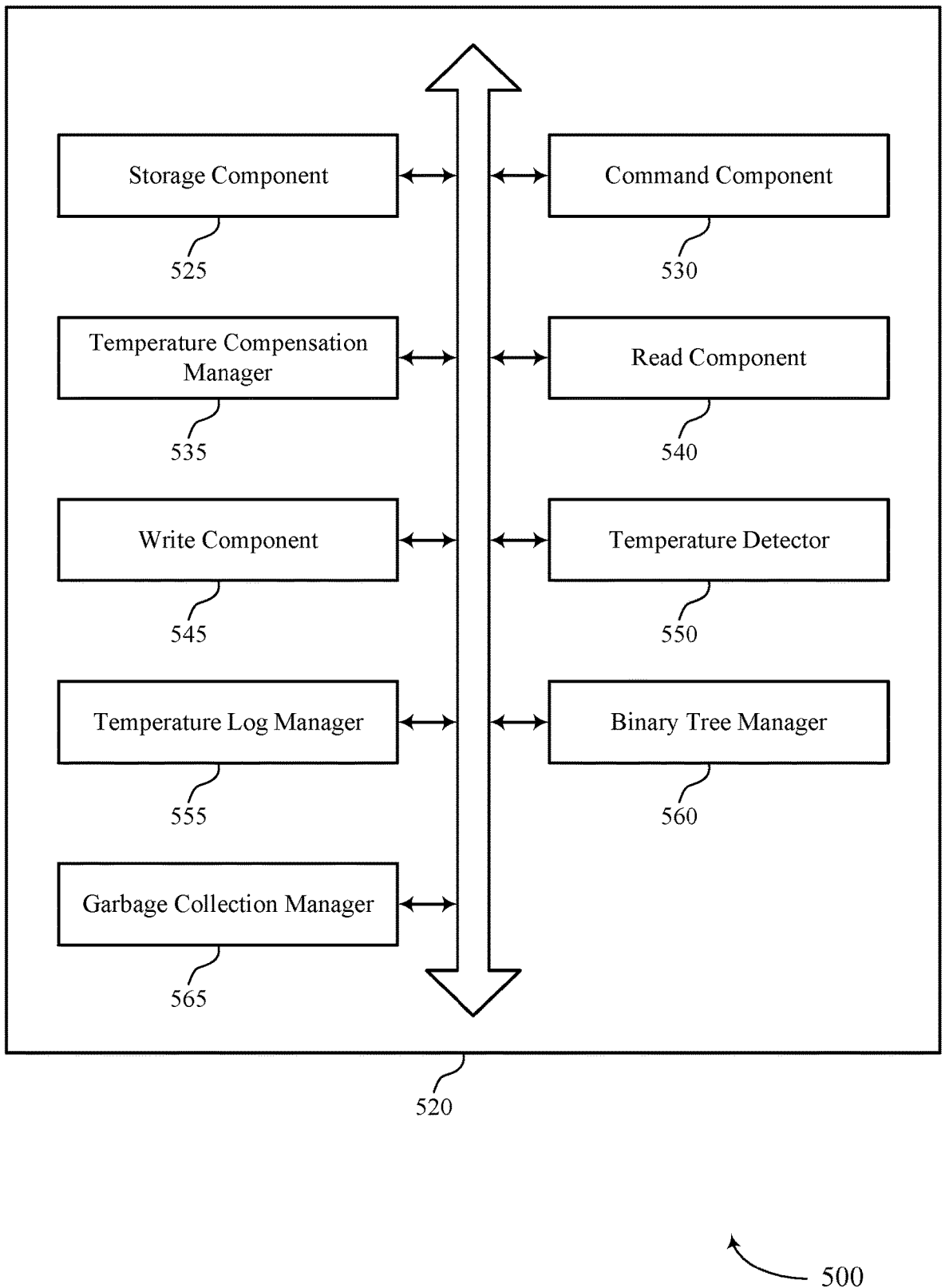
FIG. 5 shows a block diagram of a memory system that supports temperature exception tracking in a temperature log for a memory system in accordance with examples as disclosed herein.

FIG. 5 shows a block diagram 500 of a memory system 520 that supports temperature exception tracking in a temperature log for a memory system in accordance with examples as disclosed herein. The memory system 520 may be an example of aspects of a memory system as described with reference to FIGS. 1 through 4. The memory system 520, or various components thereof, may be an example of means for performing various aspects of temperature exception tracking in a temperature log for a memory system as described herein. For example, the memory system 520 may include a storage component 525, a command component 530, a temperature compensation manager 535, a read component 540, a write component 545, a temperature detector 550, a temperature log manager 555, a binary tree manager 560, a garbage collection manager 565, or any combination thereof. Each of these components may communicate, directly or indirectly, with one another (e.g., via one or more buses, data paths, or both).

The storage component 525 may be configured as or otherwise support a means for storing a set of partitions of a memory system and a temperature log including a set of temperature ranges associated with the set of partitions. The command component 530 may be configured as or otherwise support a means for receiving a command for a memory device to read a partition of the set of partitions. The temperature compensation manager 535 may be configured as or otherwise support a means for determining, based at least in part on the temperature log, whether temperature data for the partition and associated with the set of temperature ranges indicates that data was written to the partition outside a threshold temperature. The read component 540 may be configured as or otherwise support a means for reading the data from the partition based at least in part on the determining whether the temperature data for the partition indicates that the data was written to the partition outside the threshold temperature.

In some examples, the command indicates a host LBA from which to read the data, and the temperature compensation manager 535 may be configured as or otherwise support a means for determining a physical address of the partition in the memory system corresponding to the host LBA, the physical address indicating a virtual block of the memory system and a virtual page of the virtual block, where the determining whether the temperature data for the partition indicates that the data was written to the partition outside the threshold temperature is based at least in part on the determining the physical address of the partition.

In some examples, the binary tree manager 560 may be configured as or otherwise support a means for determining a binary tree corresponding to the virtual block and based at least in part on the temperature log. In some examples, the binary tree manager 560 may be configured as or otherwise support a means for searching the binary tree for a node corresponding to the virtual page and indicating a temperature range of the set of temperature ranges, where the determining whether the temperature data for the partition indicates that the data was written to the partition outside the threshold temperature is based at least in part on the temperature range indicated by the node.

In some examples, to support reading the data from the partition, the temperature compensation manager 535 may be configured as or otherwise support a means for performing a temperature compensation procedure on the data based at least in part on determining that the temperature data for the partition indicates that the data was written to the partition outside the threshold temperature, the temperature compensation procedure including adjusting one or more aspects of the data based at least in part on a temperature range of the set of temperature ranges in which the data was written at the memory system.

In some examples, to support reading the data from the partition, the temperature compensation manager 535 may be configured as or otherwise support a means for refraining from performing a temperature compensation procedure on the data based at least in part on determining that the temperature data for the partition indicates that the data was written to the partition inside the threshold temperature.

In some examples, the binary tree manager 560 may be configured as or otherwise support a means for constructing, for each virtual block of the memory system with data written outside the threshold temperature, a respective binary tree based at least in part on the temperature log, where each node of one or more nodes of each respective binary tree indicates a virtual page start index and a temperature range of the set of temperature ranges.

In some examples, the respective binary tree for each virtual block with data written outside the threshold temperature is constructed in volatile memory, and the binary tree manager 560 may be configured as or otherwise support a means for reconstructing in the volatile memory, for each virtual block of the memory system with data written outside the threshold temperature, the respective binary tree based at least in part on the temperature log and regaining power at the memory system after losing power at the memory system.

In some examples, the data was written to the partition below a first threshold temperature value, above a second threshold temperature value, below a threshold temperature range, above the threshold temperature range, or any combination thereof.

In some examples, the memory system includes one or more NAND memory devices.

In some examples, the storage component 525 may be configured as or otherwise support a means for storing a set of partitions of a memory system and a temperature log including a set of temperature ranges associated with the set of partitions. In some examples, the command component 530 may be configured as or otherwise support a means for receiving a command for a memory device to write data at the memory system. The write component 545 may be configured as or otherwise support a means for writing the data to a partition of the set of partitions corresponding to a position of the memory system based at least in part on the command. The temperature detector 550 may be configured as or otherwise support a means for determining a current temperature of the memory system at which the data is written to the partition, the current temperature entering a temperature range of the set of temperature ranges that is outside a threshold temperature. The temperature log manager 555 may be configured as or otherwise support a means for writing, to the temperature log, temperature data for the partition corresponding to the current temperature based at least in part on the current temperature entering the temperature range that is outside the threshold temperature.

In some examples, the temperature detector 550 may be configured as or otherwise support a means for triggering a temperature reading based at least in part on receiving the command to write the data at the memory system, where the current temperature is determined based at least in part on the triggered temperature reading.

In some examples, the temperature detector 550 may be configured as or otherwise support a means for triggering a temperature reading based at least in part on a periodicity, where the current temperature is determined based at least in part on the triggered temperature reading.

In some examples, to support writing, to the temperature log, the temperature data for the partition, the temperature log manager 555 may be configured as or otherwise support a means for creating, in the temperature log, a new log entry corresponding to the temperature range and indicating a virtual block corresponding to the partition and corresponding to the position at which the current temperature enters the temperature range.

In some examples, the temperature log manager 555 may be configured as or otherwise support a means for determining that the current temperature exits a previous temperature range of the set of temperature ranges. In some examples, the temperature log manager 555 may be configured as or otherwise support a means for updating, in the temperature log, a log entry corresponding to the previous temperature range to indicate the position at which the current temperature exits the previous temperature range.

In some examples, to support writing the data to the partition, the write component 545 may be configured as or otherwise support a means for writing a first portion of the data to a first virtual block. In some examples, to support writing the data to the partition, the write component 545 may be configured as or otherwise support a means for writing a second portion of the data to a second virtual block. In some examples, the temperature log manager 555 may be configured as or otherwise support a means for updating, in the temperature log, a log entry corresponding to the first virtual block to indicate a last virtual page of the first virtual block and the temperature log manager 555 may be configured as or otherwise support a means for creating, in the temperature log, a new log entry corresponding to the second virtual block and indicating a first virtual page of the second virtual block.

In some examples, the command component 530 may be configured as or otherwise support a means for receiving an additional command for the memory device to write additional data at the memory system. In some examples, the write component 545 may be configured as or otherwise support a means for writing the additional data to an additional partition of the set of partitions corresponding to an updated position of the memory system based at least in part on the additional command. In some examples, the temperature detector 550 may be configured as or otherwise support a means for determining an updated current temperature of the memory system at which the additional data is written to the additional partition is inside the threshold temperature, remains in a same temperature range of the set of temperature ranges as a preceding current temperature at which previous data was written, or both. In some examples, the temperature log manager 555 may be configured as or otherwise support a means for refraining from writing to the temperature log based at least in part on the determining the updated current temperature is inside the threshold temperature, remains in the same temperature range as the preceding current temperature at which the previous data was written, or both.

In some examples, the temperature detector 550 may be configured as or otherwise support a means for determining an updated current temperature of the memory system is inside the threshold temperature. In some examples, the garbage collection manager 565 may be configured as or otherwise support a means for performing a garbage collection procedure for the data written to the partition based at least in part on the temperature data for the partition corresponding to the current temperature that is outside the threshold temperature.

In some examples, the garbage collection manager 565 may be configured as or otherwise support a means for rewriting the data to an additional partition based at least in part on the garbage collection procedure. In some examples, the garbage collection manager 565 may be configured as or otherwise support a means for updating the temperature data for the partition from the temperature log based at least in part on rewriting the data to the additional partition. In some examples, the garbage collection manager 565 may be configured as or otherwise support a means for refraining from writing, to the temperature log, additional temperature data for the additional partition based at least in part on rewriting the data to the additional partition with the updated current temperature inside the threshold temperature.

In some examples, each log entry of the temperature log includes an indication of a respective temperature range of the set of temperature ranges, a virtual block value, a virtual page start index, a virtual page end index, a virtual page count value, or any combination thereof.

In some examples, the temperature data is stored in a first portion of the memory system different than a second portion of the memory system that stores the data.

In some examples, the first portion of the memory system includes memory cells having a first quantity of one or more levels, and the second portion of the memory system includes memory cells having a second quantity of levels greater than the first quantity of one or more levels.

In some examples, the memory cells having the first quantity of one or more levels include SLCs, and the memory cells having the second quantity of levels include QLCs.

In some examples, the current temperature enters the temperature range that is below a first threshold temperature value, above a second threshold temperature value, below a threshold temperature range, above the threshold temperature range, or any combination thereof.

In some examples, the memory system includes one or more NAND memory devices.

Figure 6:
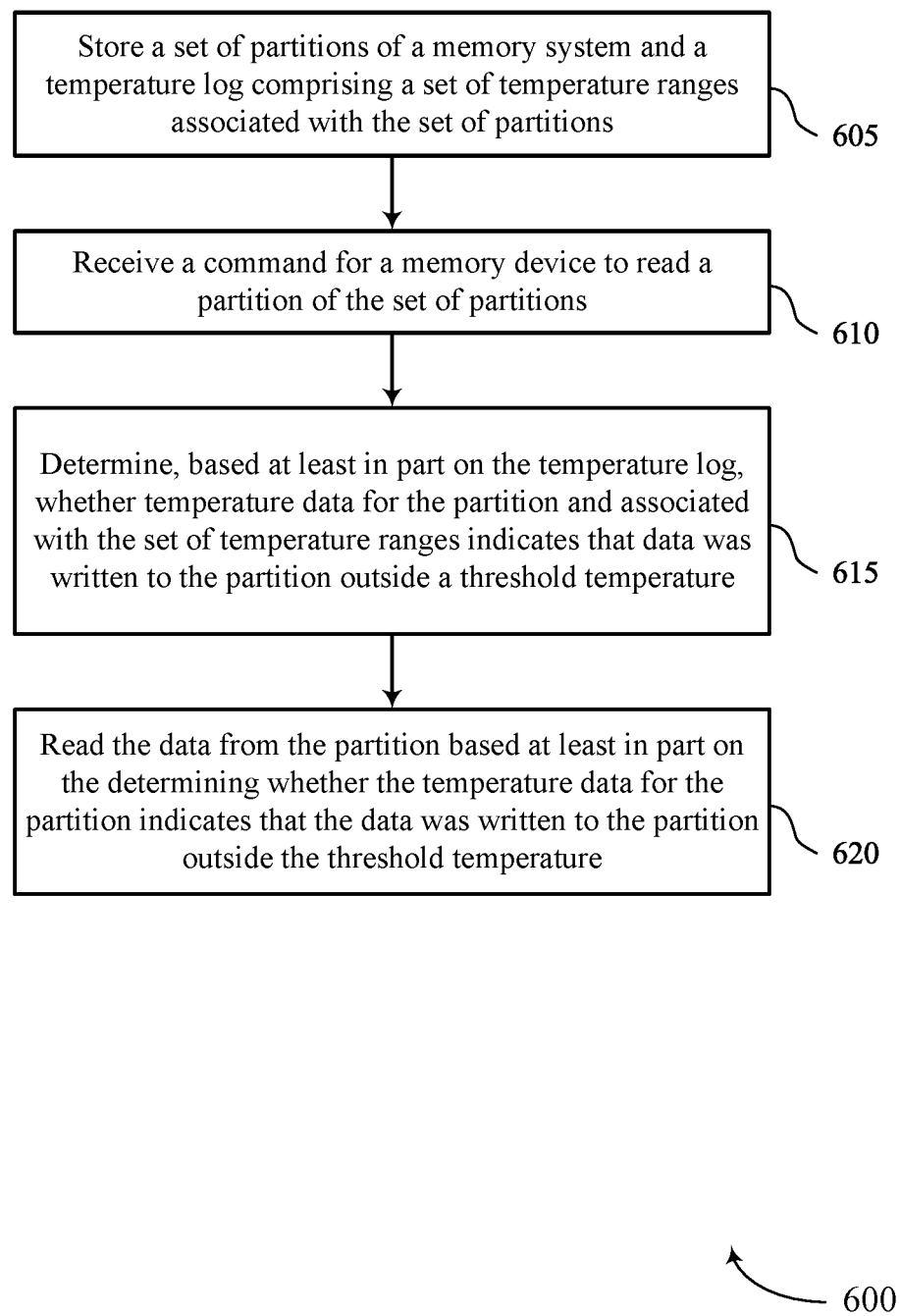
FIGS. 6 and 7 show flowcharts illustrating a method or methods that support temperature exception tracking in a temperature log for a memory system in accordance with examples as disclosed herein.

FIG. 6 shows a flowchart illustrating a method 600 that supports temperature exception tracking in a temperature log for a memory system in accordance with examples as disclosed herein. The operations of the method 600 may be implemented by a memory system or its components as described herein. For example, the operations of the method 600 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 605, the method 600 may include storing a set of partitions of a memory system and a temperature log including a set of temperature ranges associated with the set of partitions. The operations of 605 may be performed in accordance with examples as disclosed herein. In some examples, aspects of the operations of 605 may be performed by a storage component 525 as described with reference to FIG. 5.

At 610, the method 600 may include receiving a command for a memory device to read a partition of the set of partitions. The operations of 610 may be performed in accordance with examples as disclosed herein. In some examples, aspects of the operations of 610 may be performed by a command component 530 as described with reference to FIG. 5.

At 615, the method 600 may include determining, based at least in part on the temperature log, whether temperature data for the partition and associated with the set of temperature ranges indicates that data was written to the partition outside a threshold temperature. The operations of 615 may be performed in accordance with examples as disclosed herein. In some examples, aspects of the operations of 615 may be performed by a temperature compensation manager 535 as described with reference to FIG. 5.

At 620, the method 600 may include reading the data from the partition based at least in part on the determining whether the temperature data for the partition indicates that the data was written to the partition outside the threshold temperature. The operations of 620 may be performed in accordance with examples as disclosed herein. In some examples, aspects of the operations of 620 may be performed by a read component 540 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for storing a set of partitions of a memory system and a temperature log including a set of temperature ranges associated with the set of partitions, receiving a command for a memory device to read a partition of the set of partitions, determining, based at least in part on the temperature log, whether temperature data for the partition and associated with the set of temperature ranges indicates that data was written to the partition outside a threshold temperature, and reading the data from the partition based at least in part on the determining whether the temperature data for the partition indicates that the data was written to the partition outside the threshold temperature.

In some examples of the method 600 and the apparatus described herein, the command indicates a host LBA from which to read the data, and some examples of the method 600 and the apparatus described herein may include further operations, features, circuitry, logic, means, or instructions for determining a physical address of the partition in the memory system corresponding to the host LBA, the physical address indicating a virtual block of the memory system and a virtual page of the virtual block, where the determining whether the temperature data for the partition indicates that the data was written to the partition outside the threshold temperature may be based at least in part on the determining the physical address of the partition.

Some examples of the method 600 and the apparatus described herein may further include operations, features, circuitry, logic, means, or instructions for determining a binary tree corresponding to the virtual block and based at least in part on the temperature log and searching the binary tree for a node corresponding to the virtual page and indicating a temperature range of the set of temperature ranges, where the determining whether the temperature data for the partition indicates that the data was written to the partition outside the threshold temperature may be based at least in part on the temperature range indicated by the node.

In some examples of the method 600 and the apparatus described herein, reading the data from the partition may include operations, features, circuitry, logic, means, or instructions for performing a temperature compensation procedure on the data based at least in part on determining that the temperature data for the partition indicates that the data was written to the partition outside the threshold temperature, the temperature compensation procedure including adjusting one or more aspects of the data based at least in part on a temperature range of the set of temperature ranges in which the data was written at the memory system.

In some examples of the method 600 and the apparatus described herein, reading the data from the partition may include operations, features, circuitry, logic, means, or instructions for refraining from performing a temperature compensation procedure on the data based at least in part on determining that the temperature data for the partition indicates that the data was written to the partition inside the threshold temperature.

Some examples of the method 600 and the apparatus described herein may further include operations, features, circuitry, logic, means, or instructions for constructing, for each virtual block of the memory system with data written outside the threshold temperature, a respective binary tree based at least in part on the temperature log, where each node of one or more nodes of each respective binary tree indicates a virtual page start index and a temperature range of the set of temperature ranges.

In some examples of the method 600 and the apparatus described herein, the respective binary tree for each virtual block with data written outside the threshold temperature may be constructed in volatile memory, and some examples of the method 600 and the apparatus described herein may include further operations, features, circuitry, logic, means, or instructions for reconstructing in the volatile memory, for each virtual block of the memory system with data written outside the threshold temperature, the respective binary tree based at least in part on the temperature log and regaining power at the memory system after losing power at the memory system.

In some examples of the method 600 and the apparatus described herein, the data was written to the partition below a first threshold temperature value, above a second threshold temperature value, below a threshold temperature range, above the threshold temperature range, or any combination thereof.

In some examples of the method 600 and the apparatus described herein, the memory system includes one or more NAND memory devices.

Figure 7:
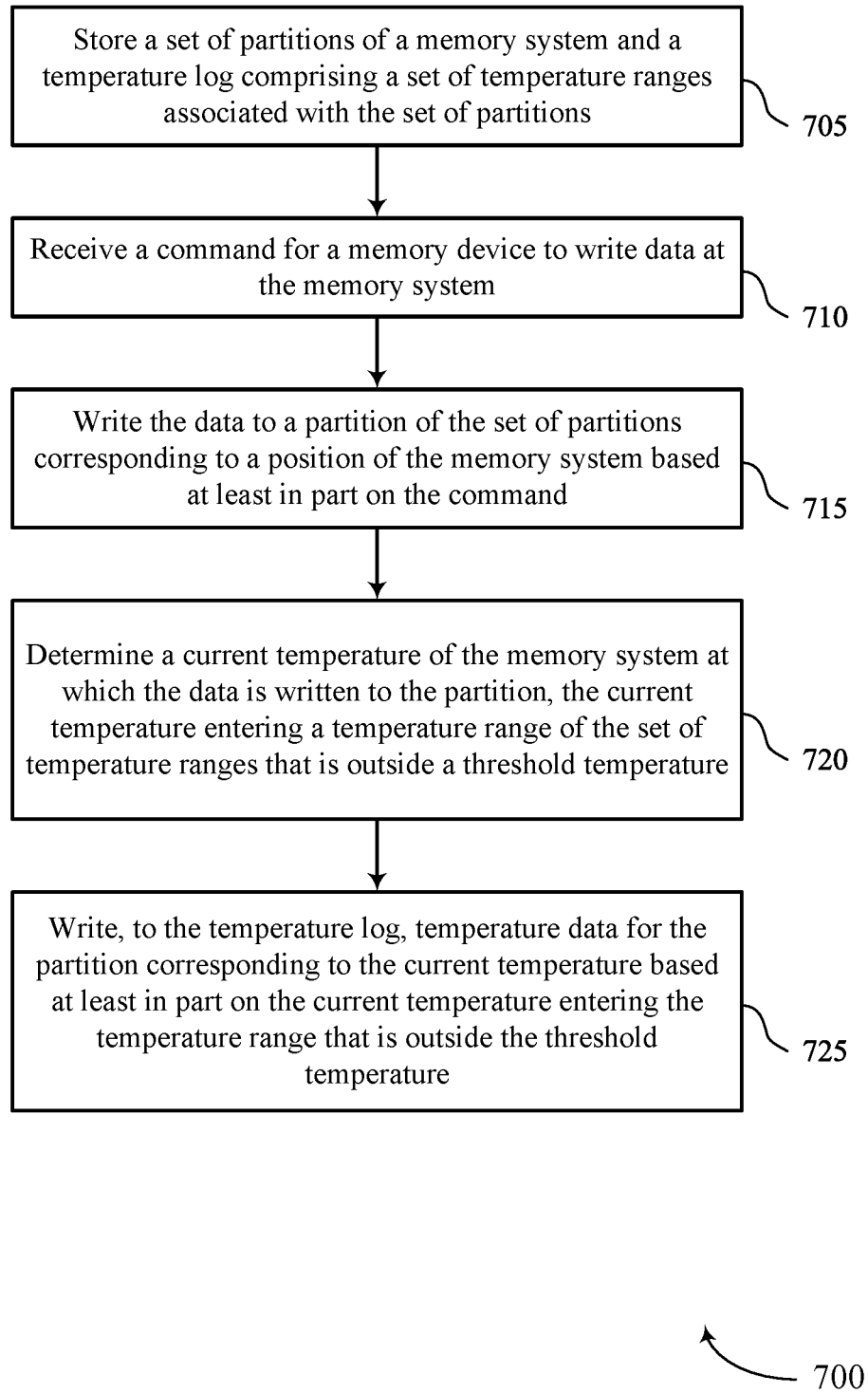

FIG. 7 shows a flowchart illustrating a method 700 that supports temperature exception tracking in a temperature log for a memory system in accordance with examples as disclosed herein. The operations of the method 700 may be implemented by a memory system or its components as described herein. For example, the operations of the method 700 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 705, the method 700 may include storing a set of partitions of a memory system and a temperature log including a set of temperature ranges associated with the set of partitions. The operations of 705 may be performed in accordance with examples as disclosed herein. In some examples, aspects of the operations of 705 may be performed by a storage component 525 as described with reference to FIG. 5.

At 710, the method 700 may include receiving a command for a memory device to write data at the memory system. The operations of 710 may be performed in accordance with examples as disclosed herein. In some examples, aspects of the operations of 710 may be performed by a command component 530 as described with reference to FIG. 5.

At 715, the method 700 may include writing the data to a partition of the set of partitions corresponding to a position of the memory system based at least in part on the command. The operations of 715 may be performed in accordance with examples as disclosed herein. In some examples, aspects of the operations of 715 may be performed by a write component 545 as described with reference to FIG. 5.

At 720, the method 700 may include determining a current temperature of the memory system at which the data is written to the partition, the current temperature entering a temperature range of the set of temperature ranges that is outside a threshold temperature. The operations of 720 may be performed in accordance with examples as disclosed herein. In some examples, aspects of the operations of 720 may be performed by a temperature detector 550 as described with reference to FIG. 5.

At 725, the method 700 may include writing, to the temperature log, temperature data for the partition corresponding to the current temperature based at least in part on the current temperature entering the temperature range that is outside the threshold temperature. The operations of 725 may be performed in accordance with examples as disclosed herein. In some examples, aspects of the operations of 725 may be performed by a temperature log manager 555 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for storing a set of partitions of a memory system and a temperature log including a set of temperature ranges associated with the set of partitions, receiving a command for a memory device to write data at the memory system, writing the data to a partition of the set of partitions corresponding to a position of the memory system based at least in part on the command, determining a current temperature of the memory system at which the data is written to the partition, the current temperature entering a temperature range of the set of temperature ranges that is outside a threshold temperature, and writing, to the temperature log, temperature data for the partition corresponding to the current temperature based at least in part on the current temperature entering the temperature range that is outside the threshold temperature.

Some examples of the method 700 and the apparatus described herein may further include operations, features, circuitry, logic, means, or instructions for triggering a temperature reading based at least in part on receiving the command to write the data at the memory system, where the current temperature may be determined based at least in part on the triggered temperature reading.

Some examples of the method 700 and the apparatus described herein may further include operations, features, circuitry, logic, means, or instructions for triggering a temperature reading based at least in part on a periodicity, where the current temperature may be determined based at least in part on the triggered temperature reading.

In some examples of the method 700 and the apparatus described herein, writing, to the temperature log, the temperature data for the partition may include operations, features, circuitry, logic, means, or instructions for creating, in the temperature log, a new log entry corresponding to the temperature range and indicating a virtual block corresponding to the partition and corresponding to the position at which the current temperature enters the temperature range.

Some examples of the method 700 and the apparatus described herein may further include operations, features, circuitry, logic, means, or instructions for determining that the current temperature exits a previous temperature range of the set of temperature ranges and updating, in the temperature log, a log entry corresponding to the previous temperature range to indicate the position at which the current temperature exits the previous temperature range.

In some examples of the method 700 and the apparatus described herein, writing the data to the partition may include operations, features, circuitry, logic, means, or instructions for writing a first portion of the data to a first virtual block and writing a second portion of the data to a second virtual block. Some examples of the method 700 and the apparatus described herein may further include operations, features, circuitry, logic, means, or instructions for updating, in the temperature log, a log entry corresponding to the first virtual block to indicate a last virtual page of the first virtual block and creating, in the temperature log, a new log entry corresponding to the second virtual block and indicating a first virtual page of the second virtual block.

Some examples of the method 700 and the apparatus described herein may further include operations, features, circuitry, logic, means, or instructions for receiving an additional command for the memory device to write additional data at the memory system, writing the additional data to an additional partition of the set of partitions corresponding to an updated position of the memory system based at least in part on the additional command, determining an updated current temperature of the memory system at which the additional data is written to the additional partition is inside the threshold temperature, remains in a same temperature range of the set of temperature ranges as a preceding current temperature at which previous data was written, or both, and refraining from writing to the temperature log based at least in part on the determining the updated current temperature is inside the threshold temperature, remains in the same temperature range as the preceding current temperature at which the previous data was written, or both.

Some examples of the method 700 and the apparatus described herein may further include operations, features, circuitry, logic, means, or instructions for determining an updated current temperature of the memory system is inside the threshold temperature and performing a garbage collection procedure for the data written to the partition based at least in part on the temperature data for the partition corresponding to the current temperature that is outside the threshold temperature.

Some examples of the method 700 and the apparatus described herein may further include operations, features, circuitry, logic, means, or instructions for rewriting the data to an additional partition based at least in part on the garbage collection procedure, updating the temperature data for the partition from the temperature log based at least in part on rewriting the data to the additional partition, and refraining from writing, to the temperature log, additional temperature data for the additional partition based at least in part on rewriting the data to the additional partition with the updated current temperature inside the threshold temperature.

In some examples of the method 700 and the apparatus described herein, each log entry of the temperature log includes an indication of a respective temperature range of the set of temperature ranges, a virtual block value, a virtual page start index, a virtual page end index, a virtual page count value, or any combination thereof.

In some examples of the method 700 and the apparatus described herein, the temperature data may be stored in a first portion of the memory system different than a second portion of the memory system that stores the data.

In some examples of the method 700 and the apparatus described herein, the first portion of the memory system includes memory cells having a first quantity of one or more levels, and the second portion of the memory system includes memory cells having a second quantity of levels greater than the first quantity of one or more levels.

In some examples of the method 700 and the apparatus described herein, the memory cells having the first quantity of one or more levels include SLCs, and the memory cells having the second quantity of levels include QLCs.

In some examples of the method 700 and the apparatus described herein, the current temperature enters the temperature range that may be below a first threshold temperature value, above a second threshold temperature value, below a threshold temperature range, above the threshold temperature range, or any combination thereof.

In some examples of the method 700 and the apparatus described herein, the memory system includes one or more NAND memory devices.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

If used to describe a conditional action or process, the terms "if," "when," "based on," "based at least in part on," and "in response to" may be interchangeable.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a 3D structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope as disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory array; and
   a controller coupled with the memory array and configured to cause the apparatus to:
      store a set of partitions of a memory system and a temperature log comprising a set of temperature ranges associated with the set of partitions;
      receive a command for a memory device to read a partition of the set of partitions;
      determine, based at least in part on the temperature log, whether temperature data for the partition and associated with the set of temperature ranges indicates that data was written to the partition outside a threshold temperature; and
      read the data from the partition based at least in part on the determining whether the temperature data for the partition indicates that the data was written to the partition outside the threshold temperature.

2. The apparatus of claim 1, wherein the command indicates a host logical block address from which to read the data, and the controller is further configured to cause the apparatus to:
   determine a physical address of the partition in the memory system corresponding to the host logical block address, the physical address indicating a virtual block of the memory system and a virtual page of the virtual block, wherein the determining whether the temperature data for the partition indicates that the data was written to the partition outside the threshold temperature is based at least in part on the determining the physical address of the partition.

3. The apparatus of claim 2, wherein the controller is further configured to cause the apparatus to:
   determine a binary tree corresponding to the virtual block and based at least in part on the temperature log; and
   search the binary tree for a node corresponding to the virtual page and indicating a temperature range of the set of temperature ranges, wherein the determining whether the temperature data for the partition indicates that the data was written to the partition outside the threshold temperature is based at least in part on the temperature range indicated by the node.

4. The apparatus of claim 1, wherein the controller configured to cause the apparatus to read the data from the partition is further configured to cause the apparatus to:
   perform a temperature compensation procedure on the data based at least in part on determining that the temperature data for the partition indicates that the data was written to the partition outside the threshold temperature, the temperature compensation procedure comprising adjusting one or more aspects of the data based at least in part on a temperature range of the set of temperature ranges in which the data was written at the memory system.

5. The apparatus of claim 1, wherein the controller configured to cause the apparatus to read the data from the partition is further configured to cause the apparatus to:
   refrain from performing a temperature compensation procedure on the data based at least in part on determining that the temperature data for the partition indicates that the data was written to the partition inside the threshold temperature.

6. The apparatus of claim 1, wherein the controller is further configured to cause the apparatus to:
construct, for each virtual block of the memory system with data written outside the threshold temperature, a respective binary tree based at least in part on the temperature log, wherein each node of one or more nodes of each respective binary tree indicates a virtual page start index and a temperature range of the set of temperature ranges.

7. The apparatus of claim 6, wherein the respective binary tree for each virtual block with data written outside the threshold temperature is constructed in volatile memory, and the controller is further configured to cause the apparatus to:
reconstruct in the volatile memory, for each virtual block of the memory system with data written outside the threshold temperature, the respective binary tree based at least in part on the temperature log and regaining power at the memory system after losing power at the memory system.

8. The apparatus of claim 1, wherein the memory system comprises one or more not-and memory devices.

9. An apparatus of comprising:
a memory array; and
a controller coupled with the memory array and configured to cause the apparatus to:
store a set of partitions of a memory system and a temperature log comprising a set of temperature ranges associated with the set of partitions;
receive a command for a memory device to read a partition of the set of partitions;
determine, based at least in part on the temperature log, whether temperature data for the partition and associated with the set of temperature ranges indicates that data was written to the partition outside a threshold temperature, wherein the data was written to the partition below a first threshold temperature value, above a second threshold temperature value, below a threshold temperature range, above the threshold temperature range, or any combination thereof; and
read the data from the partition based at least in part on the determining whether the temperature data for the partition indicates that the data was written to the partition outside the threshold temperature.

10. An apparatus, comprising:
a memory array; and
a controller coupled with the memory array and configured to cause the apparatus to:
store a set of partitions of a memory system and a temperature log comprising a set of temperature ranges associated with the set of partitions;
receive a command for a memory device to write data at the memory system;
write the data to a partition of the set of partitions corresponding to a position of the memory system based at least in part on the command;
determine a current temperature of the memory system at which the data is written to the partition, the current temperature entering a temperature range of the set of temperature ranges that is outside a threshold temperature; and
write, to the temperature log, temperature data for the partition corresponding to the current temperature based at least in part on the current temperature entering the temperature range that is outside the threshold temperature.

11. The apparatus of claim 10, wherein the controller is further configured to cause the apparatus to:
trigger a temperature reading based at least in part on receiving the command to write the data at the memory system, wherein the current temperature is determined based at least in part on the triggered temperature reading.

12. The apparatus of claim 10, wherein the controller is further configured to cause the apparatus to:
trigger a temperature reading based at least in part on a periodicity, wherein the current temperature is determined based at least in part on the triggered temperature reading.

13. The apparatus of claim 10, wherein the controller configured to cause the apparatus to write, to the temperature log, the temperature data for the partition is configured to cause the apparatus to:
create, in the temperature log, a new log entry corresponding to the temperature range and indicating a virtual block corresponding to the partition and corresponding to the position at which the current temperature enters the temperature range.

14. The apparatus of claim 10, wherein the controller is further configured to cause the apparatus to:
determine that the current temperature exits a previous temperature range of the set of temperature ranges; and
update, in the temperature log, a log entry corresponding to the previous temperature range to indicate the position at which the current temperature exits the previous temperature range.

15. The apparatus of claim 10, wherein the controller configured to cause the apparatus to write the data to the partition is configured to cause the apparatus to:
write a first portion of the data to a first virtual block; and
write a second portion of the data to a second virtual block, the controller further configured to cause the apparatus to:
update, in the temperature log, a log entry corresponding to the first virtual block to indicate a last virtual page of the first virtual block; and
create, in the temperature log, a new log entry corresponding to the second virtual block and indicating a first virtual page of the second virtual block.

16. The apparatus of claim 10, wherein the controller is further configured to cause the apparatus to:
receive an additional command for the memory device to write additional data at the memory system;
write the additional data to an additional partition of the set of partitions corresponding to an updated position of the memory system based at least in part on the additional command;
determine an updated current temperature of the memory system at which the additional data is written to the additional partition is inside the threshold temperature, remains in a same temperature range of the set of temperature ranges as a preceding current temperature at which previous data was written, or both; and
refrain from writing to the temperature log based at least in part on the determining the updated current temperature is inside the threshold temperature, remains in the same temperature range as the preceding current temperature at which the previous data was written, or both.

17. The apparatus of claim 10, wherein the controller is further configured to cause the apparatus to:
- determine an updated current temperature of the memory system is inside the threshold temperature; and
- perform a garbage collection procedure for the data written to the partition based at least in part on the temperature data for the partition corresponding to the current temperature that is outside the threshold temperature.

18. The apparatus of claim 17, wherein the controller is further configured to cause the apparatus to:
- rewrite the data to an additional partition based at least in part on the garbage collection procedure;
- update the temperature data for the partition from the temperature log based at least in part on rewriting the data to the additional partition; and
- refrain from writing, to the temperature log, additional temperature data for the additional partition based at least in part on rewriting the data to the additional partition with the updated current temperature inside the threshold temperature.

19. The apparatus of claim 10, wherein each log entry of the temperature log comprises an indication of a respective temperature range of the set of temperature ranges, a virtual block value, a virtual page start index, a virtual page end index, a virtual page count value, or any combination thereof.

20. The apparatus of claim 10, wherein the temperature data is stored in a first portion of the memory system different than a second portion of the memory system that stores the data.

21. The apparatus of claim 20, wherein the first portion of the memory system comprises memory cells having a first quantity of one or more levels, and the second portion of the memory system comprises memory cells having a second quantity of levels greater than the first quantity of one or more levels.

22. The apparatus of claim 21, wherein the memory cells having the first quantity of one or more levels comprise single-level cells, and the memory cells having the second quantity of levels comprise quad-level cells.

23. The apparatus of claim 10, wherein the current temperature enters the temperature range that is below a first threshold temperature value, above a second threshold temperature value, below a threshold temperature range, above the threshold temperature range, or any combination thereof.

24. The apparatus of claim 10, wherein the memory system comprises one or more not-and memory devices.

25. A non-transitory computer-readable medium storing code comprising instructions which, when executed by a processor of an electronic device, cause the electronic device to:
- store a set of partitions of a memory system and a temperature log comprising a set of temperature ranges associated with the set of partitions;
- receive a command for a memory device to read a partition of the set of partitions;
- determine, based at least in part on the temperature log, whether temperature data for the partition and associated with the set of temperature ranges indicates that data was written to the partition outside a threshold temperature; and
- read the data from the partition based at least in part on the determining whether the temperature data for the partition indicates that the data was written to the partition outside the threshold temperature.

\* \* \* \* \*